US010700124B1

(12) United States Patent
Yang et al.

(10) Patent No.: US 10,700,124 B1
(45) Date of Patent: Jun. 30, 2020

(54) SPIN-ORBIT TORQUE MAGNETORESISTIVE RANDOM ACCESS MEMORY AND METHOD FOR MANUFACTURING THE SAME

(71) Applicant: INSTITUTE OF MICROELECTRONICS, CHINESE ACADEMY OF SCIENCES, Beijing (CN)

(72) Inventors: Meiyin Yang, Beijing (CN); Jun Luo, Beijing (CN); Tengzhi Yang, Beijing (CN); Jing Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/411,431

(22) Filed: May 14, 2019

(30) Foreign Application Priority Data

Dec. 26, 2018 (CN) .......................... 2018 1 1654324

(51) Int. Cl.
| | |
|---|---|
| *H01L 27/22* | (2006.01) |
| *H01L 43/08* | (2006.01) |
| *H01L 43/10* | (2006.01) |
| *H01L 43/12* | (2006.01) |

(52) U.S. Cl.
CPC ............ *H01L 27/224* (2013.01); *H01L 43/08* (2013.01); *H01L 43/10* (2013.01); *H01L 43/12* (2013.01)

(58) Field of Classification Search
CPC ................. H01L 27/222–228; H01L 43/08–12
See application file for complete search history.

(56) References Cited

U.S. PATENT DOCUMENTS 10,210,920 B1 * 2/2019 Chen ...................... G11C 17/16

* cited by examiner

*Primary Examiner* — Daniel P Shook
(74) *Attorney, Agent, or Firm* — Goodwin Procter LLP

(57) ABSTRACT

A spin-orbit torque magnetoresistive random access memory, and a method for manufacturing a spin-orbit torque magnetoresistive random access memory are provided. The spin-orbit torque magnetoresistive random access memory includes a spin-orbit coupling layer and a magnetoresistive tunnel junction located on the spin-orbit coupling layer. The magnetoresistive tunnel junction includes a first magnetic layer, a tunneling layer, and a second magnetic layer that are sequentially stacked from bottom to top, and each of the first magnetic layer and the second magnetic layer has perpendicular anisotropy. In a direction of a current in the spin-orbit coupling layer, defects are generated in a part of the magnetoresistive tunnel junction by an ion implantation process.

12 Claims, 4 Drawing Sheets

SPIN-ORBIT TORQUE MAGNETORESISTIVE RANDOM ACCESS MEMORY AND METHOD FOR MANUFACTURING THE SAME

The application claims the priority to Chinese patent application No. 201811654324.1 titled "SPIN-ORBIT TORQUE MAGNETORESISTIVE RANDOM ACCESS MEMORY AND METHOD FOR MANUFACTURING THE SAME", filed with the Chinese Patent Office on Dec. 26, 2018, which is incorporated herein by reference in its entirety.

FIELD

The present disclosure relates to the field of semiconductor devices and manufacture therefor, and in particular to a spin-orbit torque magnetoresistive random access memory, and a method for manufacturing the spin-orbit torque magnetoresistive random access memory.

BACKGROUND

With the development of memory technology and electronic technology, random access memories are widely used, and may be independent of or integrated into a device using the random access memories, such as a processor, an application specific integrated circuit or a system on a chip.

A spin-orbit torque magnetoresistive random access memory (SOT-MRAM) is a magnetic random access memory that performs random access through rotation of a magnetic moment. The SOT-MRAM has advantages of high-speed reading and writing, high integration, and unlimited times of repeated writing. In the SOT-MRAM, a spin current is generated through spin-orbit coupling, and the magnetic moment of the magnet is induced to rotate. However, a rotation direction of the magnetic moment is random under the current. An effective data access requires the magnetic moment to rotate in a fixed direction. Therefore, how to achieve the rotation of the magnetic moment in a fixed direction becomes a research focus for the SOT-MRAM.

SUMMARY

In view of this, a spin-orbit torque magnetoresistive random access memory, and a method for manufacturing a spin-orbit torque magnetoresistive random access memory are provided, to achieve rotation of a magnetic moment in a memory in a fixed direction.

The following technical solutions are provided in the present disclosure.

The spin-orbit torque magnetoresistive random access memory provided in the present disclosure includes a spin-orbit coupling layer and a magnetoresistive tunnel junction located on the spin-orbit coupling layer. The magnetoresistive tunnel junction includes a first magnetic layer, a tunneling layer, and a second magnetic layer that are sequentially stacked from bottom to top, and each of the first magnetic layer and the second magnetic layer has perpendicular anisotropy. In a direction of a current in the spin-orbit coupling layer, defects are generated in a part of the magnetoresistive tunnel junction by an ion implantation process.

In an embodiment, ions implanted in the ion implantation process include N, As, Ar, Be or P.

In an embodiment, the magnetoresistive tunnel junction further includes a pinning layer located on the second magnetic layer and a protective layer located on the pinning layer.

In an embodiment, a greater number of defects among the generated defects in the magnetoresistive tunnel junction are distributed in the first magnetic layer and the second magnetic layer than other layers in the magnetoresistive tunnel junction.

In an embodiment, each of the first magnetic layer and the second magnetic layer is made of Co, Fe, CoFeB or FePt.

The method for manufacturing a spin-orbit torque magnetoresistive random access memory provided in the present disclosure includes:

providing a substrate;
forming a spin-orbit coupling layer on the substrate;
forming a magnetoresistive tunnel junction on the spin-orbit coupling layer, where the magnetoresistive tunnel junction includes a first magnetic layer, a tunneling layer, and a second magnetic layer that are sequentially stacked from bottom to top, and each of the first magnetic layer and the second magnetic layer has perpendicular anisotropy; and
generating defects in a part of the magnetoresistive tunnel junction in a direction of a current in the spin-orbit coupling layer by an ion implantation process.

In an embodiment, the generating defects in a part of the magnetoresistive tunnel junction in a direction of a current in the spin-orbit coupling layer by an ion implantation process includes:

forming a mask layer on a surface of a part of the magnetoresistive tunnel junction in the direction of the current in the spin-orbit coupling layer;
generating the defects in a part of the magnetoresistive tunnel junction which is not covered with the mask layer by the ion implantation process; and
removing the mask layer.

In an embodiment, the magnetoresistive tunnel junction further includes a pinning layer located on the second magnetic layer and a protective layer located on the pinning layer.

In an embodiment, ions implanted in the ion implantation process include N, As, Ar, Be or P.

In an embodiment, each of the first magnetic layer and the second magnetic layer is made of Co, Fe, CoFeB or FePt.

In the spin-orbit torque magnetoresistive random access memory and the method for manufacturing a spin-orbit torque magnetoresistive random access memory provided in the present disclosure, a magnetoresistive tunnel junction is arranged on a spin-orbit coupling layer. In a direction of a current in the spin-orbit coupling layer, defects are generated in a part of the magnetoresistive tunnel junction by an ion implantation process. In this way, the part of the magnetoresistive tunnel junction has a local nonuniform defect distribution, so that a magnetoresistive tunnel junction having a lateral asymmetric structure is formed in a direction perpendicular to a current source. When a current is supplied to the spin-orbit coupling layer, a magnetic moment in a magnetic layer can rotate in a fixed direction.

BRIEF DESCRIPTION OF THE DRAWINGS

In order to more clearly illustrate technical solutions in the embodiments of the present disclosure or in the conventional technology, the drawings used in the description of the embodiments or the conventional technology are briefly described hereinafter. Apparently, the drawings in the fol

DETAILED DESCRIPTION

In order to make the above objects, features and advantages of the present disclosure more clear and easy to be understood, embodiments of the present disclosure are described in detail hereinafter in conjunction with the drawings.

In the following description, various specific details are illustrated to provide a thorough understanding of the present disclosure. The present disclosure may also be carried out in other ways than those described herein. Those skilled in the art may make modifications to the present disclosure without departing from the spirit of the present disclosure, and the present disclosure is not limited to the specific embodiments disclosed hereinafter.

In addition, the present disclosure is described in detail in conjunction with the drawings. In detailed description of the embodiments of the present disclosure, a sectional view showing a device structure may be partially enlarged for the convenience of description, and the drawings show only examples of the present disclosure, which are not intended to limit the scope of the present disclosure. Further, three-dimensional dimensions including a length, a width and a depth should be considered in an actual manufacture process.

As described in the background, the magnetic random access memory that performs random access through rotation of a magnetic moment has advantages of high-speed reading and writing, high integration, and unlimited times of repeated writing. A spin current is generated through spin-orbit coupling, and the magnetic moment of the magnet is induced to rotate. In this case, a rotation direction of the magnetic moment is random under the current. Therefore, the magnetic moment should be controlled to rotate in a fixed direction to perform the effective data access, so as to facilitate integration and industrialization of the spin-orbit torque magnetoresistive random access memory.

In view of the above, a spin-orbit torque magnetoresistive random access memory (SOT-MRAM) is provided in the present disclosure. In a direction of a current in a spin-orbit coupling layer, defects are generated in a part of a magnetoresistive tunnel junction by an ion implantation process. In this way, the part of the magnetoresistive tunnel junction has a local nonuniform defect distribution, so that a magnetoresistive tunnel junction having a lateral asymmetric structure is formed in a direction perpendicular to a current source. When a current is supplied to the spin-orbit coupling layer, a magnetic moment of a magnetic layer is asymmetric, and thus the magnetic moment in the magnetic layer can rotate in a fixed direction.

Figure 1:
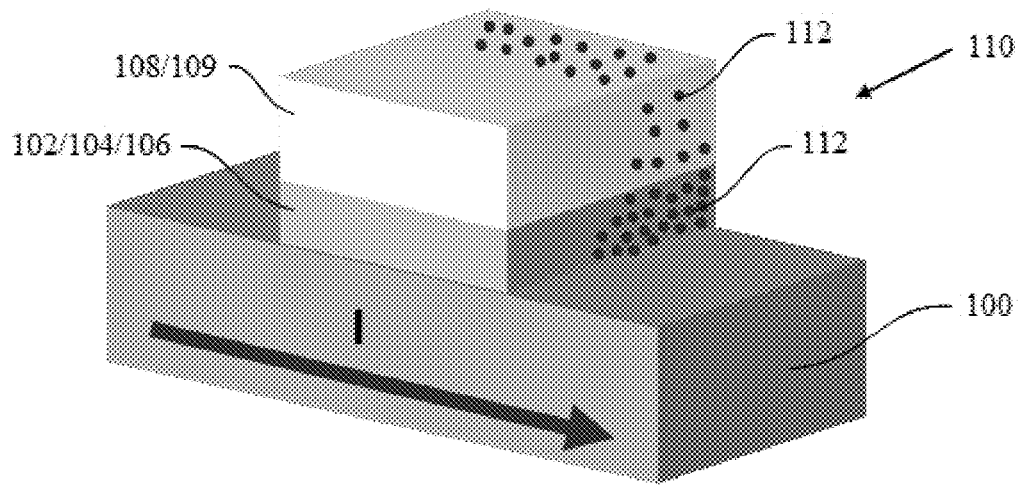
- FIG. 1 is a schematic perspective view of a spin-orbit torque magnetoresistive random access memory according to an embodiment of the present disclosure.
Figure 2:
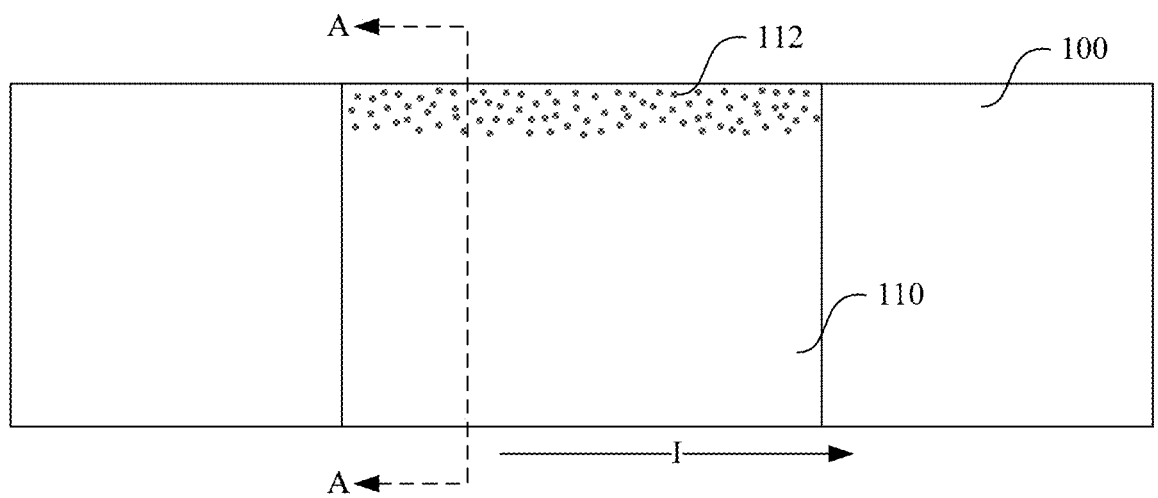
FIG. 2 is a schematic top view of the spin-orbit torque magnetoresistive random access memory according to the embodiment of the present disclosure.
Figure 3:
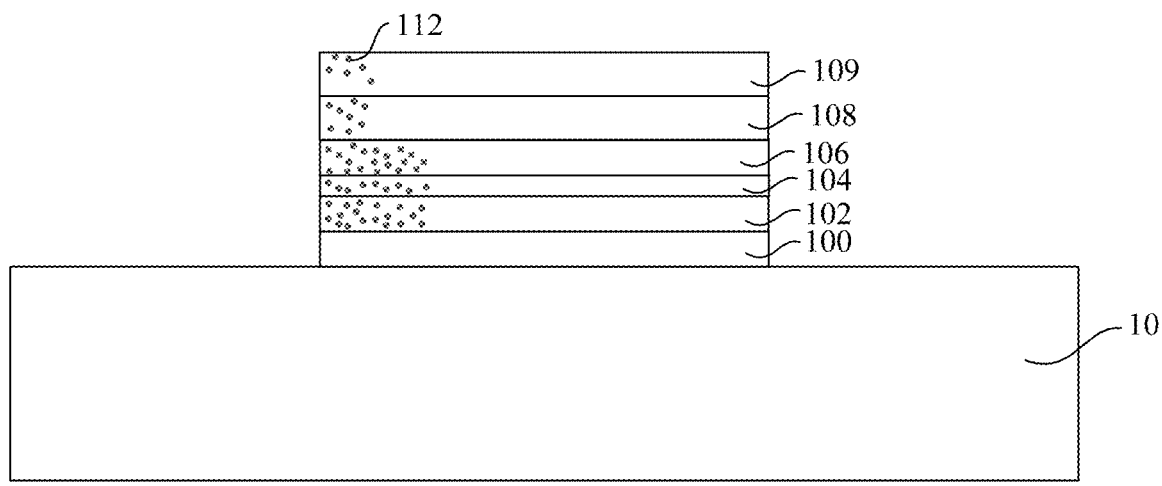
FIG. 3 is a schematic sectional view of the spin-orbit torque magnetoresistive random access memory taken along a line AA shown in FIG. 2.

Referring to FIGS. 1 to 3, the SOT-MRAM includes: a spin-orbit coupling layer 100, and a magnetoresistive tunnel junction 110 located on the spin-orbit coupling layer 100.

The magnetoresistive tunnel junction 110 includes a first magnetic layer 102, a tunneling layer 104, and a second magnetic layer 106 that are sequentially stacked from bottom to top. Each of the first magnetic layer 102 and the second magnetic layer 106 has perpendicular anisotropy.

In a direction of a current I in the spin-orbit coupling layer 100, defects 112 are generated in a part of the magnetoresistive tunnel junction 110 by an ion implantation process.

In an embodiment of the present disclosure, the spin-orbit coupling layer 100 is made of a material having a spin-orbit coupling effect. The spin-orbit coupling layer 100 may generally be a metal layer or a topological insulator layer having the spin-orbit coupling effect. In an embodiment, the spin-orbit coupling layer may be made of a material having a large spin-orbit coupling strength. The metal layer may be made of, for example, Ta, Pt, W, Hf, Ir, CuBi, CuIr, or AuW. The topological insulator layer may be made of, for example, BiSn, SnTe, BiSe, or a compound from group IVA, VA or VIA.

The magnetoresistive tunnel junction 110 includes the first magnetic layer 102, the tunneling layer 104, and the second magnetic layer 106 that are sequentially stacked from bottom to top, and each of the first magnetic layer 102 and the second magnetic layer 106 is made of a ferromagnetic material having perpendicular anisotropy. The ferromagnetic material may be an elementary substance, an alloy, or a metal oxide having magnetic properties. For example, the ferromagnetic material may be a hard magnetic material such as Co, Fe, CoFeB or FePt. The first magnetic layer 102 and the second magnetic layer 106 may be made of the same or different materials according to specific requirements.

The tunneling layer 104 is located between the first magnetic layer 102 and the second magnetic layer 106. The tunneling layer 104 may be made of a non-magnetic metal such as Cu or Ag, or an insulating material such as aluminum oxide, magnesium oxide or hafnium oxide.

Further, the magnetoresistive tunnel junction 110 may further include a pinning layer 108 located on the second magnetic layer 106. The pinning layer 108 is used to orientate the magnetic moment direction. For convenience of description, the pinning layer 108 on the second magnetic layer 106 may be referred to as a top pinning layer, and a bottom pinning layer may be provided between the first magnetic layer 102 and the magnetoresistive tunnel junction 110. The pinning layer may be made of, for example, an artificial antiferromagnetic material such as a CoPt multi-layer film.

Further, the magnetoresistive tunnel junction 110 may further include a protective layer 109 located on the pinning layer 108. The protective layer 109 is used to prevent the magnetoresistive tunnel junction 110 from oxidation. The protective layer 109 may generally be made of a metal material such as Ta or Ru.

For convenience of description, the direction of the current I is referred to as a length direction of the spin-orbit coupling layer. In an embodiment, the spin-orbit coupling layer 100 may have a structure of a strip tunnel. The magnetoresistive tunnel junction 110 may be arranged at a middle portion of the spin-orbit coupling layer 100 with respect to the length direction of the spin-orbiting coupling layer 100. The magnetoresistive tunnel junction 110 may also be arranged symmetrically with respect to a center line the spin-orbit coupling layer 100 in the length direction. In specific applications, a shape and a size of the magnetoresistive tunnel junction 110 may be determined according to requirements. In a preferred embodiment, the magnetoresistive tunnel junction 110 may have a shape of a bar, and a width of the bar may be substantially equal to or different from that of the spin-orbit coupling layer 100.

In an embodiment of the present disclosure, the defects 112 are in a part of the magnetoresistive tunnel junction 110 in the direction of the current I in the spin-orbit coupling layer 100 by an ion implantation process. That is, with the direction of the current I in the spin-orbit coupling layer 100 as a reference direction, the defects 112 are formed in only one part of the magnetoresistive tunnel junction 110 in the reference direction, as shown in FIG. 1. The current I is a current supplied to the spin-orbit coupling layer 100, that is used for inducing the magnetic moment in the magnetoresistive tunnel junction 110 to rotate, that is, a supplied current for data information writing. The direction of the current I indicates a dimension in which the direction of the current I is located.

The defects 112 are generated by the ion implantation process. During the ion implantation process, the implanted ions enter the magnetoresistive tunnel junction 110 at certain energy, so that the structure and the composition of the part of the magnetoresistive tunnel junction 110 implanted with the ions change, which leads to the generation of the defects 112. The distribution of the defects 112 is nonuniform. No defect repairing process such as a thermal annealing process is performed after the ion implantation process, so that the defects 112 remain in the part of the magnetoresistive tunnel junction 110. In this way, the part of the magnetoresistive tunnel junction has a local nonuniform defect distribution, so that a magnetoresistive tunnel junction having a lateral asymmetric structure is formed in a direction perpendicular to a current source. When a current is supplied to the spin-orbit coupling layer, a magnetic moment of a magnetic layer is asymmetric, and thus the magnetic moment in the magnetic layer can rotate in a fixed direction.

In specific applications, the implanted ions may be any ion that can generate defects. In an embodiment, the implanted ions may be ions of N, As, Be, Ar, P or B, or any ion that can be provided by an existing ion implanter. In addition, during the implantation process, the type and the dosage of the ions to be implanted may be determined according to specific requirements. In some applications, ions having a small atomic radius may be selected, which can reduce the damage to a lattice of the tunnel junction, and a high implantation dosage may be selected to enhance the rotation effect. In other applications, ions having a large atomic radius may be selected, which results in serious damage to the lattice of the tunnel junction, but has a good rotation effect. In this case, a small implantation dosage may be selected to reduce the damage to the lattice.

Different numbers of defects may be distributed in different layers in the magnetoresistive tunnel junction 110. In an embodiment, there are more defects in the first magnetic layer 102 and the second magnetic layer 106 than other layers in the magnetoresistive tunnel junction 110. That is, a greater number of defects are distributed in the first magnetic layer 102 and the second magnetic layers 106 than the other layers. In this way, a peak of the concentration of the implanted ions is in the magnetic layer, so that the lateral asymmetric structure of the magnetic layer can be ensured, and thus the magnetic moment in the magnetic layer can rotate in a fixed direction.

In specific applications, the SOT-MRAMs may be arranged in an array to form a SOT-MRAM memory array. The SOT-MRAM memory array may be independent of or integrated in a device using the SOT-MRAM memory array. The device may be, for example, a processor, an application specific integrated circuit or a system on a chip.

The structure of the magnetoresistive random access memory is described above according to the embodiment of the present disclosure. It should be understood that the magnetoresistive random access memory may further include another necessary component in specific applications.

Figure 4:
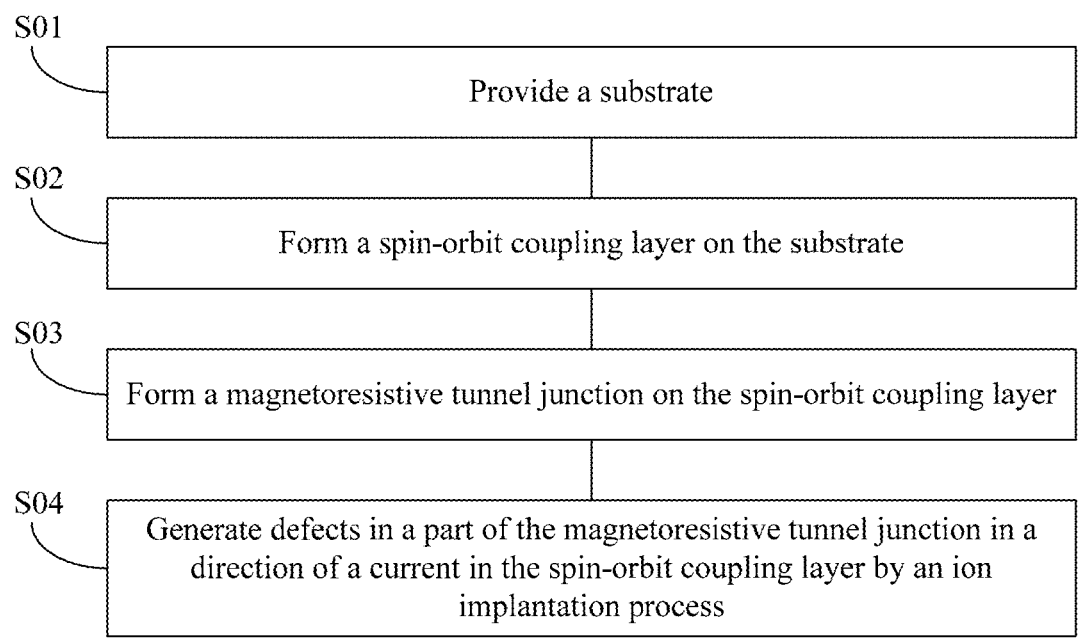
FIG. 4 is a flowchart of a method for manufacturing a spin-orbit torque magnetoresistive random access memory according to an embodiment of the present disclosure.

In addition, a method for manufacturing the magnetoresistive random access memory is further provided in the present disclosure. The method includes the following steps S01 to S04, which is described in detail below with reference to a flowchart shown in FIG. 4.

Figure 6:
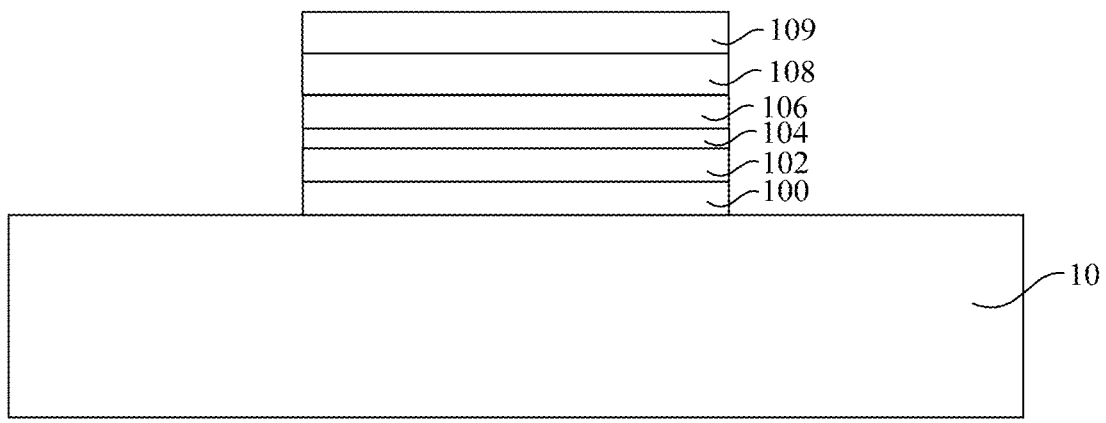

In step S01, a substrate 10 is provided, as shown in FIG. 6.

In embodiments of the present disclosure, the substrate 10 is mainly used as a support structure, and may be implemented by a semiconductor substrate such as a silicon (Si) substrate, a germanium (Ge) substrate, a silicon-germanium (SiGe) substrate, a silicon-on-insulator (SOI) substrate, or a germanium-on-insulator (GOI) substrate, or other substrates. In an embodiment, the substrate 10 may be implemented by a silicon substrate.

In step S02, a spin-orbit coupling layer 100 is formed on the substrate 10, as shown in FIG. 6.

In step S03, a magnetoresistive tunnel junction 110 is formed on the spin-orbit coupling layer 100. The magnetoresistive tunnel junction 110 includes a first magnetic layer 102, a tunneling layer 104, and a second magnetic layer 106 that are sequentially stacked from bottom to top, and each of the first magnetic layer 102 and the second magnetic layer 106 has perpendicular anisotropy, as shown in FIG. 6.

In an embodiment, the spin-orbit coupling layer 100 made of the metal material such as Ta and Pt and having a thickness of, for example, 3 nm to 5 nm, may be grown by a physical vapor deposition (PVD) process. In another embodiment, the spin-orbit coupling layer 100 made of the topological insulator material such as BiSn and SnTe and having a thickness of, for example, 3 nm to 10 nm may be grown by a molecular beam epitaxy (MBE) process. In some embodiments, the grown spin-orbit coupling layer 100 may be patterned by an etching process to form a tunnel structure of the spin-orbit coupling layer 100.

Figure 5:
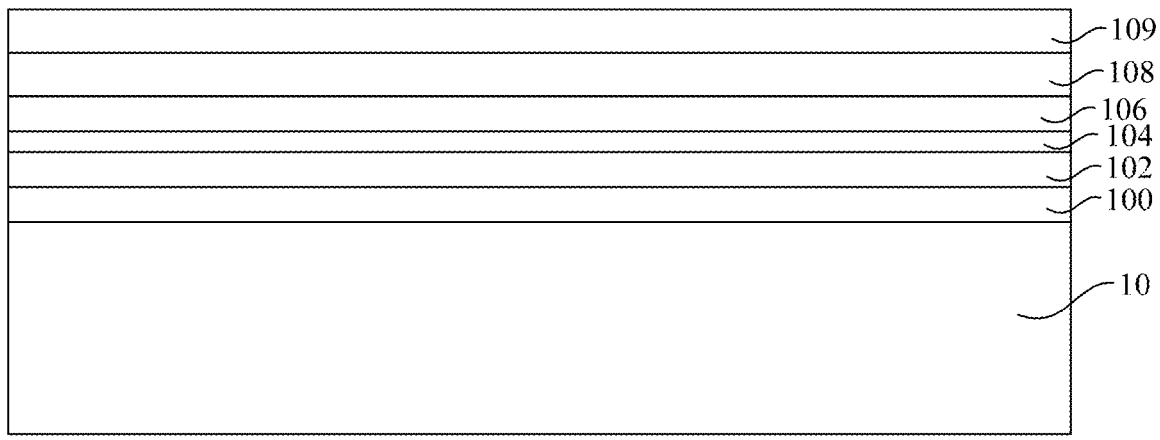
FIGS. 5 to 8 are schematic sectional views of intermediate structures formed during a process of forming a memory by using the manufacturing method according to the embodiment of the present disclosure.

In other embodiments, after the spin-orbit coupling layer 100 is grown, the magnetoresistive tunnel junction 110 is grown, as shown in FIG. 5. Next, the spin-orbiting coupling layer 100 is firstly patterned, and then the magnetoresistance tunnel junction 110 is patterned, as shown in FIG. 6.

Specifically, firstly, the spin-orbit coupling layer 100, the first magnetic layer 102, the tunneling layer 104, the second magnetic layer 106, the pinning layer 108 and the protective layer 109 are sequentially grown, as shown in FIG. 5.

The first magnetic layer 102 made of a material such as Co or CoFeB and having a thickness of about 1 nm, the tunneling layer 104 made of MgO and having a thickness of 0.8 nm, the second magnetic layer 106 made of a material such as Co or CoFeB and having a thickness of 1 nm, the artificial antiferromagnetic pinning layer 108 made of a CoPt multilayer film and having a thickness of 4 nm to 6 nm, and the protective layer 109 made of Ta and having a thickness of 4 nm to 6 nm, may be sequentially grown by a sputtering process or other suitable processes.

Next, the protective layer 109, the pinning layer 108, the second magnetic layer 106, the tunneling layer 104, the first magnetic layer 102, and the spin-orbit coupling layer 100 are etched until reaching the surface of the substrate 10, to form a patterned spin-orbit coupling layer 100. Then, the protective layer 109, the pinning layer 108, the second magnetic layer 106, the tunneling layer 104, and the first magnetic layer 102 are continuously etched, to form a patterned magnetoresistive tunnel junction 110 on the spin-orbit coupling layer 100, as shown in FIG. 6.

Figure 8:
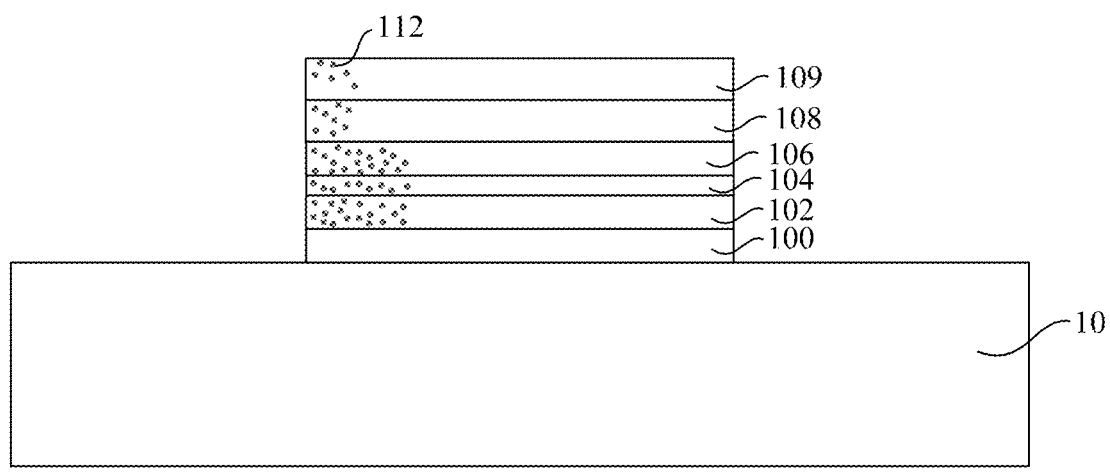

In step S04, defects are generated in a part of the magnetoresistive tunnel junction 110 in a direction of a current I in the spin-orbit coupling layer 100 by an ion implantation process, as shown in FIG. 8.

During the ion implantation process, the implanted ions enter the magnetoresistive tunnel junction 110 at certain implantation energy, so that the structure and the composition of the part of the magnetoresistive tunnel junction 110 implanted with the ions change, which leads to the generation of the defects 112. The distribution of the defects 112 is nonuniform. In the present disclosure, no defect repairing process such as a thermal annealing process is performed after the ion implantation process, so that the defects 112 remain in the part of the magnetoresistive tunnel junction 110. In this way, the tunnel junction structure of the part of the magnetoresistive tunnel junction having a local nonuniform defect distribution can be formed.

Specifically, the defects may be generated in a part of the magnetoresistive tunnel junction 110 in the direction of the current I in the spin-orbit coupling layer 100 by the following steps.

Figure 7:
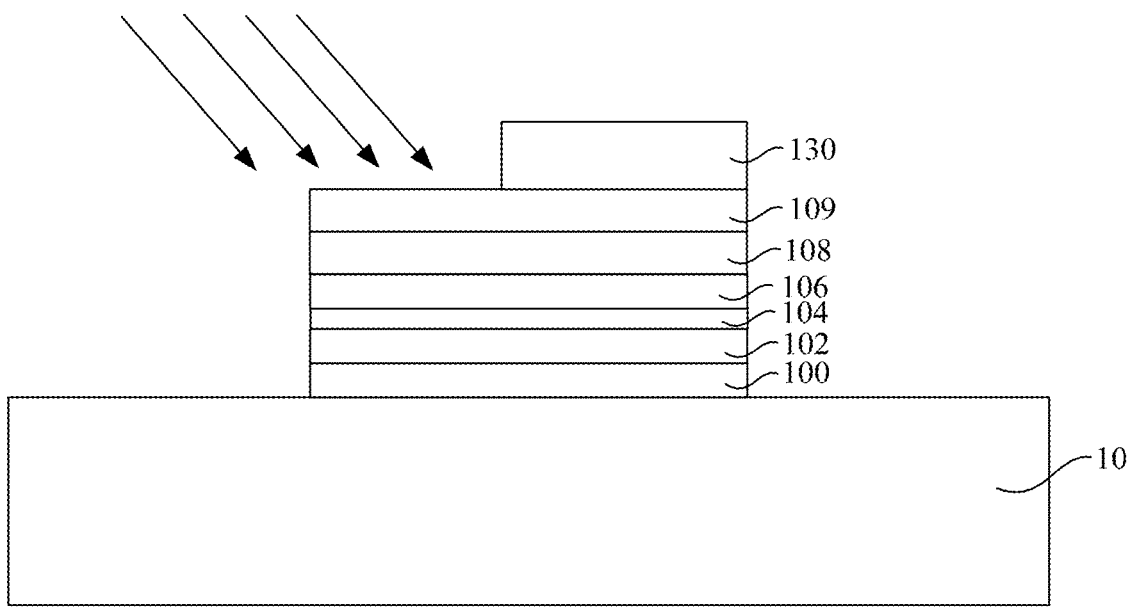

Firstly, a mask layer 130 is formed a surface of a part of the magnetoresistive tunnel junction 110 in the direction of the current I in the spin-orbit coupling layer 110, as shown in FIG. 7.

The mask layer 130 may be made of a photoresist. Specifically, a photoresist is coated by a spin coating process, and the mask layer 130 having the photoresist is formed by a photolithographic process. In specific applications, with respect to the direction of the current I, the mask layer 130 at least covers one part of the magnetoresistive tunnel junction 110, and may further cover the exposed spin-orbit coupling layer 100 and the surface of the substrate 10.

Next, the defects 112 are generated in a part of the magnetoresistive tunnel junction 110 which is not covered with the mask layer 130 by the ion implantation process, and then the mask layer 130 is removed, as shown in FIGS. 7 to 8. It should be understood that, depending on different process controls, the spin-orbit coupling layer 110 may be implanted with ions and thus generates defects during the ion implantation process.

In specific applications, the implanted ions may be any ion that can generate defects. In an embodiment, the implanted ions may be ions of N, As, Be, P, B or Ar. The defects may be generated in the part of the magnetoresistive tunnel junction 110 which is not covered with the mask layer 130 by process control such as implantation energy, an ion implantation concentration, and an ion implantation angle according to specific requirements.

Specifically, the ion implantation angle may be adjusted such that the peak of the concentration of the implanted ions is in the magnetic layer, and thus there are more defects in the first magnetic layer 102 and the second magnetic layer 106 than other layers in the magnetoresistive tunnel junction 110. That is, a greater number of defects are distributed in the first magnetic layer 102 and second magnetic layer 106 than the other layers.

Thus, the SOT-MRAM according to the embodiment of the present disclosure is formed. Other components may be made according to the requirements.

The above embodiments are only preferred embodiments of the present disclosure. The preferred embodiments according to the present disclosure are disclosed above, but are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made to the above embodiments based on the technical essence of the present disclosure without departing the content of the technical solutions of the present disclosure fall within the protection scope of the technical solutions of the present disclosure.

The invention claimed is:

1. A spin-orbit torque magnetoresistive random access memory, comprising:
 a spin-orbit coupling layer; and
 a magnetoresistive tunnel junction located on the spin-orbit coupling layer, wherein
 the magnetoresistive tunnel junction comprises a first magnetic layer, a tunneling layer, and a second magnetic layer that are sequentially stacked from bottom to top, and each of the first magnetic layer and the second magnetic layer has perpendicular anisotropy; and
 in a direction of a current in the spin-orbit coupling layer, defects are generated in a part of the magnetoresistive tunnel junction by an ion implantation process.

2. The spin-orbit torque magnetoresistive random access memory according to claim 1, wherein ions implanted in the ion implantation process comprise N, As, Ar, Be or P.

3. The spin-orbit torque magnetoresistive random access memory according to claim 2, wherein a greater number of defects among the generated defects in the magnetoresistive tunnel junction are distributed in the first magnetic layer and the second magnetic layer than other layers in the magnetoresistive tunnel junction.

4. The spin-orbit torque magnetoresistive random access memory according to claim 1, wherein the magnetoresistive tunnel junction further comprises a pinning layer located on the second magnetic layer and a protective layer located on the pinning layer.

5. The spin-orbit torque magnetoresistive random access memory according to claim 4, wherein a greater number of defects among the generated defects in the magnetoresistive tunnel junction are distributed in the first magnetic layer and the second magnetic layer than other layers in the magnetoresistive tunnel junction.

6. The spin-orbit torque magnetoresistive random access memory according to claim 1, wherein a greater number of defects among the generated defects in the magnetoresistive tunnel junction are distributed in the first magnetic layer and the second magnetic layer than other layers in the magnetoresistive tunnel junction.

7. The spin-orbit torque magnetoresistive random access memory according to claim 1, wherein each of the first magnetic layer and the second magnetic layer is made of Co, Fe, CoFeB or FePt.

8. A method for manufacturing a spin-orbit torque magnetoresistive random access memory, the method comprising:
- providing a substrate;
- forming a spin-orbit coupling layer on the substrate;
- forming a magnetoresistive tunnel junction on the spin-orbit coupling layer, wherein the magnetoresistive tunnel junction comprises a first magnetic layer, a tunneling layer, and a second magnetic layer that are sequentially stacked from bottom to top, and each of the first magnetic layer and the second magnetic layer has perpendicular anisotropy; and
- generating defects in a part of the magnetoresistive tunnel junction in a direction of a current in the spin-orbit coupling layer by an ion implantation process.

9. The method according to claim 8, wherein the generating defects in a part of the magnetoresistive tunnel junction in a direction of a current in the spin-orbit coupling layer by an ion implantation process comprises:
- forming a mask layer on a surface of a part of the magnetoresistive tunnel junction in the direction of the current in the spin-orbit coupling layer;
- generating the defects in a part of the magnetoresistive tunnel junction which is not covered with the mask layer by the ion implantation process; and
- removing the mask layer.

10. The method according to claim 9, wherein ions implanted in the ion implantation process comprise N, As, Ar, Be or P.

11. The method according to claim 8, wherein the magnetoresistive tunnel junction further comprises a pinning layer located on the second magnetic layer and a protective layer located on the pinning layer.

12. The method according to claim 8, wherein each of the first magnetic layer and the second magnetic layer is made of Co, Fe, CoFeB or FePt.

* * * * *